United States Patent
Dobisz et al.

(10) Patent No.: US 10,388,860 B2
(45) Date of Patent: Aug. 20, 2019

(54) METHOD FOR MANUFACTURING HIGH DENSITY MAGNETIC RANDOM ACCESS MEMORY DEVICES USING DIAMOND LIKE CARBON HARD MASK

(71) Applicant: Spin Transfer Technologies, Inc., Fremont, CA (US)

(72) Inventors: Elizabeth A. Dobisz, San Jose, CA (US); Girish Jagtiani, Santa Clara, CA (US); Yuan-Tung Chin, Fremont, CA (US); Thomas D. Boone, San Carlos, CA (US); Mustafa Pinarbasi, Morgan Hill, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 15/859,459

(22) Filed: Dec. 30, 2017

(65) Prior Publication Data

US 2019/0207106 A1    Jul. 4, 2019

(51) Int. Cl.
| | |
|---|---|
| *H01L 43/12* | (2006.01) |
| *H01L 43/08* | (2006.01) |
| *H01F 10/32* | (2006.01) |
| *G11C 11/16* | (2006.01) |
| *H01L 27/22* | (2006.01) |

(52) U.S. Cl.
CPC .............. *H01L 43/12* (2013.01); *H01L 43/08* (2013.01); *G11C 11/161* (2013.01); *H01F 10/329* (2013.01); *H01F 10/3286* (2013.01); *H01L 27/222* (2013.01)

(58) Field of Classification Search
None
See application file for complete search history.

(56) References Cited

U.S. PATENT DOCUMENTS

| | | | |
|---|---|---|---|
| 2004/0161925 A1* | 8/2004 | Yoshimura | G11B 5/855 438/637 |
| 2005/0104242 A1* | 5/2005 | Olaru | B29C 45/2737 264/40.6 |
| 2011/0049655 A1* | 3/2011 | Assefa | H01L 27/222 257/421 |
| 2011/0120878 A1* | 5/2011 | Hong | G11B 5/1278 205/205 |

(Continued)

*Primary Examiner* — Mounir S Amer
(74) *Attorney, Agent, or Firm* — Zilka-Kotab, P.C.

(57) ABSTRACT

A method for manufacturing magnetic random access memory. The method allows very high density magnetic memory elements to be formed on a magnetic memory chip. A magnetic memory element material is deposited and a diamond like carbon (DLC) hard mask is formed over the magnetic memory element material. An ion or atom bombardment process such as ion milling is performed to remove portions of the magnetic memory element material that are not protected by the hard mask to form a plurality of magnetic memory element pillars. Because the diamond like carbon hard mask is resistant to the material removal processes such as ion milling, it can be made very thin (10-20 nm), which reduces shadowing while still allowing a process such as ion milling to be used to define the magnetic data element pillars. This advantageously allows the pillars to be formed with well defined, vertical sidewalls, and avoiding shorting.

18 Claims, 20 Drawing Sheets

(56) References Cited

U.S. PATENT DOCUMENTS

| | | | | |
|---|---|---|---|---|
| 2011/0198314 | A1* | 8/2011 | Wang | B82Y 25/00 |
| | | | | 216/22 |
| 2012/0306033 | A1* | 12/2012 | Satoh | H01L 27/222 |
| | | | | 257/421 |
| 2014/0256109 | A1* | 9/2014 | Yin | H01L 29/6653 |
| | | | | 438/300 |
| 2015/0104882 | A1* | 4/2015 | Jung | H01L 43/12 |
| | | | | 438/3 |
| 2017/0084828 | A1* | 3/2017 | Hsu | H01L 43/12 |

* cited by examiner

METHOD FOR MANUFACTURING HIGH DENSITY MAGNETIC RANDOM ACCESS MEMORY DEVICES USING DIAMOND LIKE CARBON HARD MASK

FIELD OF THE INVENTION

The present invention relates to magnetic random access memory (MRAM) and more particularly to a method for manufacturing small pitch high density MRAM devices using diamond like carbon (DLC) as a hard mask and CMP stop layer.

BACKGROUND

Magnetic Random Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When, the orientations of the magnetizations of the free and reference layer are oriented in the same direction, the spin of the electrons in the free layer are in generally the same direction as the orientation of the spin of the electrons in the reference layer. Because these electron spins are in generally the same direction, the electrons can pass relatively easily through the tunnel barrier layer. However, if the orientations of the magnetizations of the free and reference layers are opposite to one another, the spin of electrons in the free layer will be generally opposite to the spin to the electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as an on or "1", whereas the high resistance state can be read as a "0". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded date bit is non-volatile in that it remains intact in the absence of any electrical power.

SUMMARY

The present invention provides a method for manufacturing high density magnetic random access memory. The method includes depositing a magnetic memory element material over a substrate. A diamond like carbon (DLC) hard mask is patterned over the magnetic memory element material so as to define a plurality of pillars. A material removal process is then performed to remove portions of the magnetic memory element material that are not protected by the diamond like carbon hard mask, thereby defining a plurality of magnetic memory element pillars.

The material removal process can be an ion or atom bombardment process such as ion milling. Because diamond like carbon (DLC) is very resistant to removal by such processes, it can be made thin while still providing sufficient masking for withstanding the material removal process.

This reduced mask thickness advantageously reduces shadowing during the material removal process, resulting in improved pillar definition and allowing the magnetic memory element pillars to be formed much closer together without the risk of electrical shorting between memory element pillars.

The carbon hard mask also advantageously serves as a very effective stop layer for later performed chemical mechanical polishing (CMP). Therefore, the carbon layer serves as both a hard mask for ion milling definition of the memory element pillars, and also as a CMP stop layer, eliminating the need for separate hard mask and CMP structures, and also eliminating the need for a thick TaN hard mask structure which would result in increased shadowing effect during ion milling.

The diamond like carbon hard mask can be formed by depositing a layer of diamond like carbon by a process such as sputter deposition, plasma vapor deposition or filtered cathodic arc deposition. A layer of photoresist can be spun onto the diamond like carbon layer. The layer of photoresist can then be patterned by photolithography or electron beam exposure. A reactive ion etching process can then be used to transfer the image of the photoresist mask onto the underlying layer of diamond like carbon. The reactive ion etching can be performed in an atmosphere that includes oxygen, such as $O_2$ or $CO_2$.

After the material removal process has been performed, a thin layer of electrically insulating material can be deposited in-situ to protect the sides of the formed pillars. Then, an electrically insulating fill layer such as $SiO_2$ or alumna can be deposited.

This process is also well suited for use with a partial milling process. In such as process, a first ion milling is performed sufficiently to remove only the upper magnetic layer (i.e. free magnetic layer), near or just beyond the non-magnetic barrier layer. A thin layer of insulating material such as alumina is deposited to protect the sides of the free layer, and then a second ion milling is performed to remove the rest of the memory element material.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
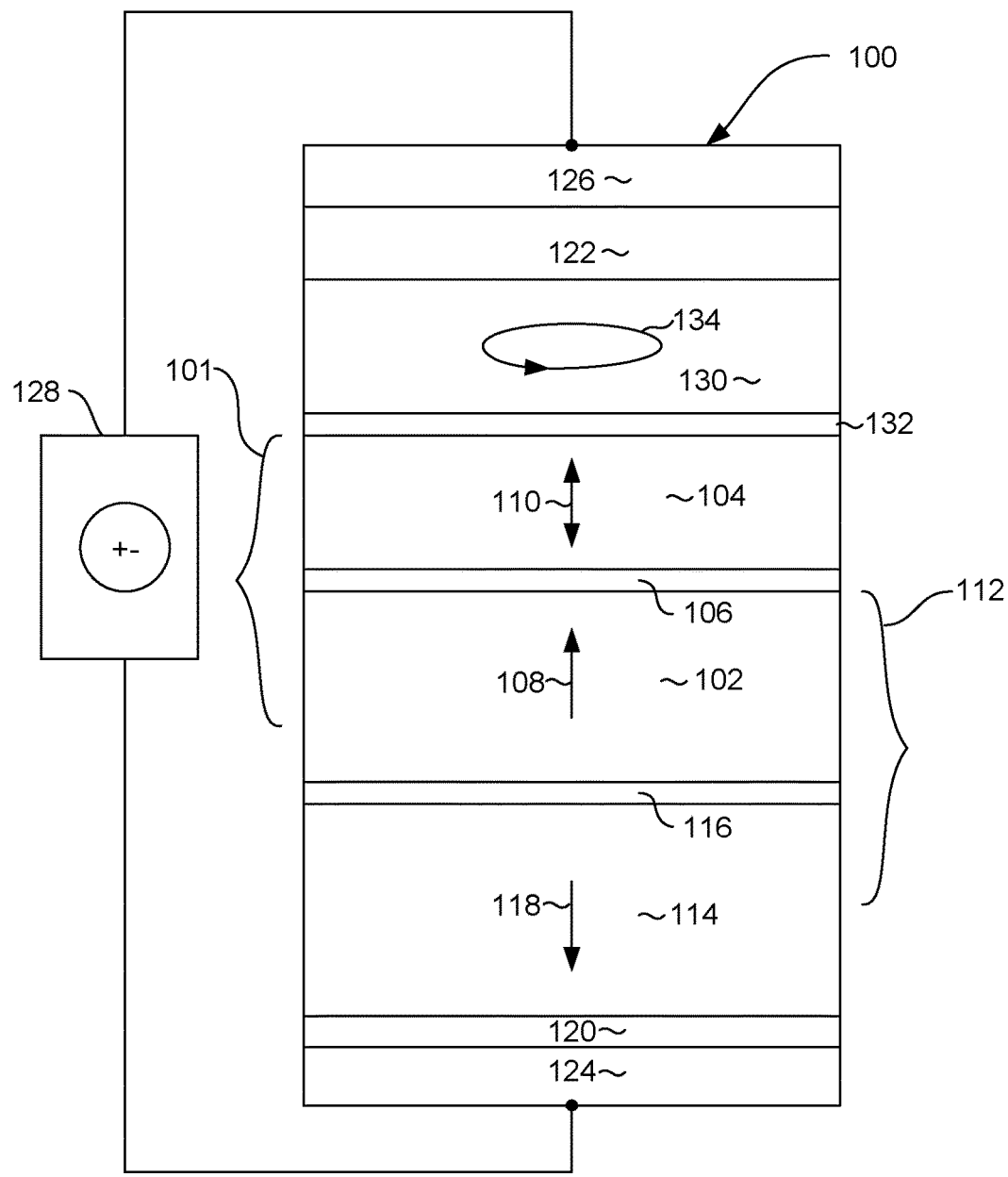
FIG. 1 is a schematic, cross sectional view of a perpendicular magnetic tunnel junction (pTMR) element, such as might be used in an embodiment of the invention.

Referring now to FIG. 1, a magnetic memory element 100 can be in the form a of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating magnetic barrier layer 106 located between the magnetic reference layer 102, and magnetic free layer 104. The barrier layer 106 can be an oxide such as MgO. The magnetic reference layer has a magnetization 108 that is fixed in a direction that is preferably perpendicular to the plane of the layers as indicated by arrow 108. The magnetic free layer has a magnetization 110 that can be in either of two directions perpendicular to the plane of the layer 104. While the magnetization 110 of the free layer remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure 112 that can include a magnetic keeper layer 114, and a non-magnetic, antiparallel coupling layer 116 located between the keeper layer 114 and reference layer 102. The antiparallel coupling layer 116 can be a material such as Ru and can be constructed to have a thickness such that it will ferromagnetically antiparallel couple the layers 114, 102. The antiparallel coupling between the layers 114, 102 pins the magnetization 108 of the reference layer 102 in a direction opposite to the direction of magnetization 118 of the keeper layer 114.

A seed layer 120 may be provided near the bottom of the memory element 100 to initiate a desired crystalline structure in the above deposited layers. A capping layer 122 may be provided near the top of the memory element 100 to protect the underlying layers during manufacture, such as during high temperature annealing. Also, electrodes 124, 126 may be provided at the top and bottom of the memory element 100. The electrodes 124, 126 may be constructed of a non-magnetic, electrically conductive material such as Au and can provide electrical connection with circuitry 128 that can include a current source and can further include circuitry for reading an electrical resistance across the memory element 100.

The magnetic free layer 104 has a magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in an upward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in a downward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons will not be able to pass through the barrier layer 106. As a result, the electrons (which have been spin polarized by the magnetization 110 of the free layer 104, will accumulate at the junction between the free layer 104 and barrier layer 106. This accumulation of spin polarized electrons causes a spin torque that causes the magnetization 110 of the free layer 104 to flip from a downward direction to an upward direction.

In order to assist the switching of the magnetization 110 of the free layer 104, the memory element 100 may include a spin polarization layer 130 formed above the free layer 104. The spin polarization layer can be separated from the free layer 104 by an exchange coupling layer 132. The spin polarization layer 130 has a magnetic anisotropy that causes it to have a magnetization 134 with a primary component oriented in the in plane direction (e.g. perpendicular to the magnetizations 110, 108 of the free and reference layers 104, 102. The magnetization 134, of the spin polarization layer 130 may either be fixed or can move in a precessional manner as shown in FIG. 100. The magnetization 134 of the spin polarization layer 130 causes a spin torque on the free layer 104 that assists in moving its magnetization away from its quiescent state perpendicular to the plane of the free layer 104. This allows the magnetization 110 of the free layer 104 to more easily flip using less energy when applying a write current to the memory element 100.

In a magnetic memory device it is desirable to form many magnetic element pillars, such as the magnetic element 100, as possible in a given space on a substrate. In order to maximize data density, it is desirable to many such memory element pillars close together with as small a spacing between pillars as possible. However, currently available manufacturing techniques have limited the amount by which this spacing between pillars can be reduced, thereby limiting available data density.

In semiconductor processing, etching (such as reactive ion etching) has been used to remove material to define desired structure shapes. In a reactive ion etching process, reactive ions interact with the surface material to form volatile reaction products that are pumped away in the vacuum. Such a process can very selectively remove a desired material and can be very anisotropic, resulting in sharp sidewall definition. However, in the manufacture of magnetic tunnel junctions for use in MRAM application, the use of reactive ion etching has shown limited success, especially at high densities. Magnetic tunnel junction elements, such as those used in MRAM applications are composed of multiple layers of magnetic material, some of which are less than 1 nm thick. Rather than reactive ion etching, neutral ion or atom bombardment, such as ion milling, can be used to effectively remove the materials of a tunnel junction sensor. However, such neutral ion or atom bombardment techniques have little selectivity of the tunnel junction material over the mask material. That is to say, the method removes the mask material as well as the desired tunnel junction material. In order to ensure sufficient mask structure to fully define a tunnel junction structure, the mask structure must be very thick, having a high topography. Unfortunately, such a tall mask structure results in shadowing from both the mask structure and the tunnel junction pillar being formed. This especially problematic when the mask is used for both an ion milling mask and a chemical mechanical polishing (CMP) stop layer. For example, a TaN mask layer having a thickness of 70-100 nm could be used as a pillar defining mask and also as a protective mask during later chemical mechanical polishing processes.

However, the use of such a tall mask structure adds to problems related to shadowing effects. The formation of the magnetic pillars, such as by ion milling, leads to re-deposition of etched material, which can cause shorting between memory elements. This can be mitigated by performing the ion milling at various angles to form well defined side walls with no re-deposited material at the sides. However, the effectiveness of this angled ion milling is limited by the tall topography of the milled structures at very high densities, because of shadowing effects from adjacent pillar structures. The use of a tall mask structure only adds to this problem by further increasing the shadowing effect. However, as mentioned above, the use of a mask material such as TaN as both an ion milling hard mask and a CMP stop layer requires that the mask layer be constructed very thick, such as about 50-70 nm. The present invention provides a method for overcoming these challenges to form high density tunnel junction sensors with well defined vertical sidewall formation while also avoiding shorting issues related to re-deposition of removed material.

Figure 2:
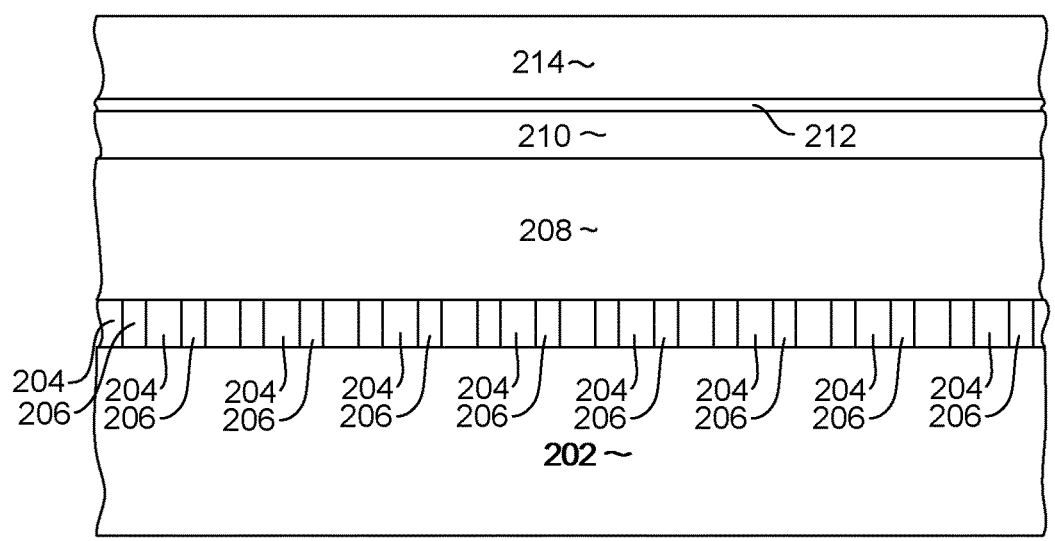
FIGS. 2-14 show views of a magnetic memory device in various intermediate stages of manufacture in order to illustrate a method of manufacturing a magnetic data device according to an embodiment of the invention.

FIGS. 2-14 show side, cross sectional views of a magnetic random access memory device in various intermediate stages of manufacture, illustrating a method of manufacturing a high density magnetic data device. With particular reference to FIG. 2, a substrate 202 is formed, which can include circuitry such as CMOS structures embedded therein. One or more electrical contacts 204 are formed over the circuitry 202 to allow electrical connection between the underlying circuitry and the yet to be formed magnetic data element pillars. The electrical contacts 204 can be separated from one another by electrically insulating material 206, such as $SiO_2$ or $SiN_x$. A layer of magnetic memory element material 208 is deposited full film over the electrical contacts 204 and insulation 206. A capping layer and/or electrical contact layer 210 can be formed over the magnetic element layer 208. Although shown as a single layer, the magnetic memory element layer 208 actually includes various layers needed to construct a magnetic memory element. These layers can include the layers of the magnetic memory element 100 described above with reference to FIG. 1. However, this is by way of illustrating an example of a possible magnetic memory element structure. Other various different layers could be included in the layer 208 in order to construct any of various types of Magnetic Random Access Memory structures.

Figure 3:
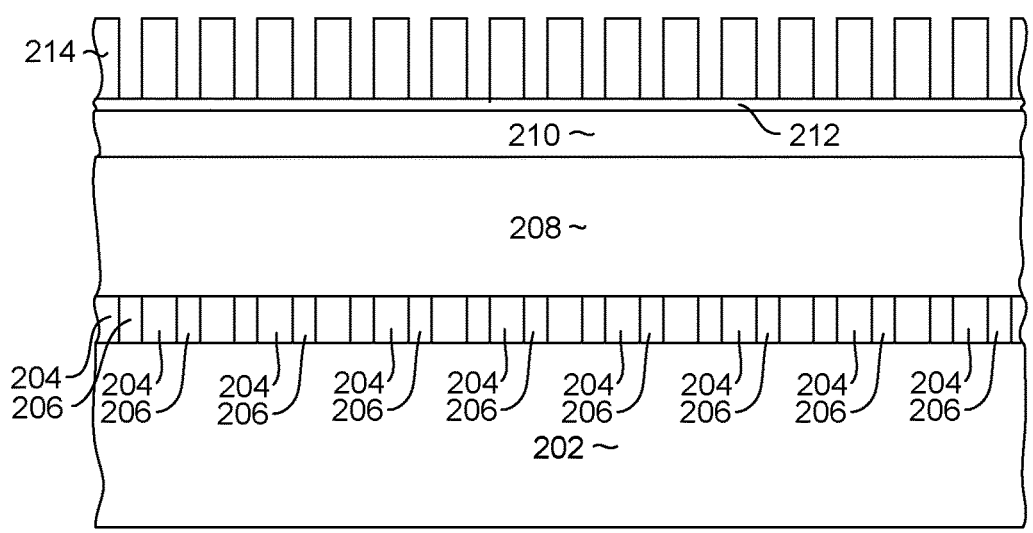

With continued reference to FIG. 2, a layer of Diamond Like Carbon (DLC) 212 is deposited over the magnetic memory element layer 208 and cap/electrical contact layer 210. A mask layer 214 can then be deposited over the DLC layer 212. The mask layer 214 can be a spin-on glass type photoresist layer with a Bottom Anti-reflective Coating (BARC) (not shown). The photoresist mask 214 can be photolithographically patterned to form a mask configured to define a series of pillars having a close pitch as shown in FIG. 3. Alternatively, rather than using photolithography, an electron beam process can be used to define the mask pattern.

Because Diamond Like Carbon (DLC) has excellent resistance to ion milling and excellent resistance to removal by Chemical Mechanical Polishing (CMP), the DLC layer can be deposited much thinner than another mask structure such as TaN. For example, the DLC layer 212 can be deposited to a thickness of only 10-20 nm as compared with 70 nm for a TaN mask layer. The DLC layer can be deposited by various different methods including sputter deposition, Plasma Vapor Deposition (PVD), or filtered cathodic arc (FCA). The denser the DLC layer 212 is the better it will perform. As an example, filtered cathodic arc (FCA) carbon yields excellent resistance to ion milling and CMP.

Figure 4:
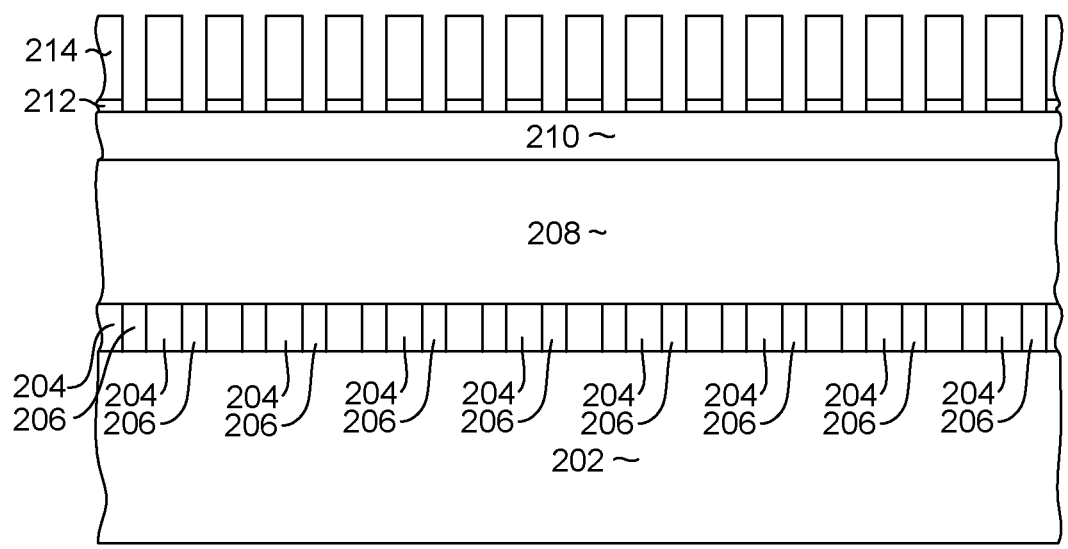

With reference to FIG. 4, a reactive ion etching process can be performed to transfer the image of the photoresist mask 214 onto the underlying DLC hard mask material 212. The reactive ion etching can be performed in an oxygen containing atmosphere such as $O_2$ or $CO_2$, which exhibits excellent selectivity for removing the diamond like carbon (DLC) 212. After the image of the photoresist mask 214 has been transferred onto the underlying DLC hard mask layer 212, the layer of photoresist 214 (and any anti-reflective coating) can be removed by a liftoff process such as chemical lift-off or reactive ion etching.

Figure 5:
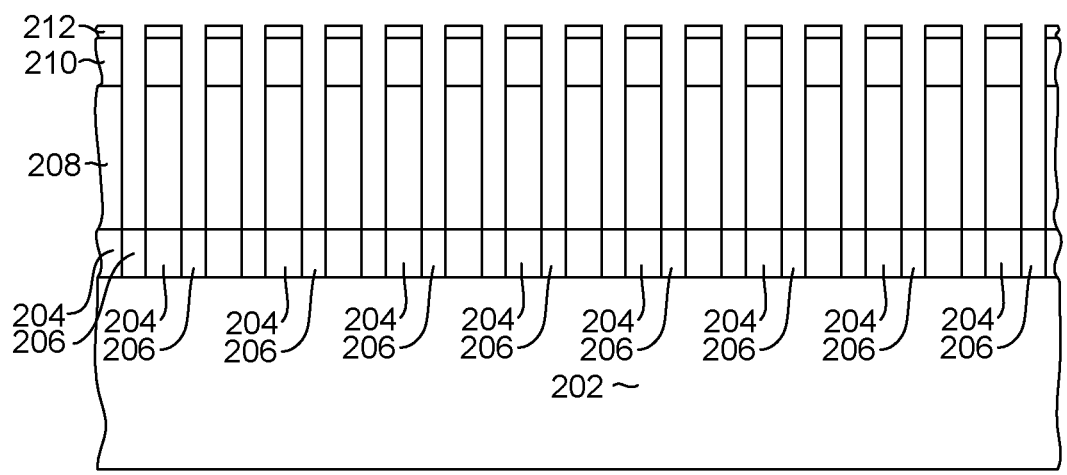

With reference now to FIG. 5, an ion or atom bombardment process such as ion milling can be performed to remove portions of the MTJ material 208 and cap/contact material 210 that are not protected by the DLC mask 212 in order to transfer the image of the DLC hard mask 212 onto these layers 208, 210, and to form MTJ pillars. Because the DLC layer 212 has a high resistance to removal by ion or atom bombardment process (e.g. ion milling), the DLC hard mask will, advantageously, remain intact during this process. The ion milling can be performed at one or more angles relative to normal in order to form well defined pillar sidewalls without re-deposition. Because the DLC layer 212 can be formed thinner than other types of mask structures, the thin mask 212 results in less shadowing effect during ion milling, leading to improved ability to perform the ion milling at the desired angles, and resulting in improved pillar formation.

Figure 6:
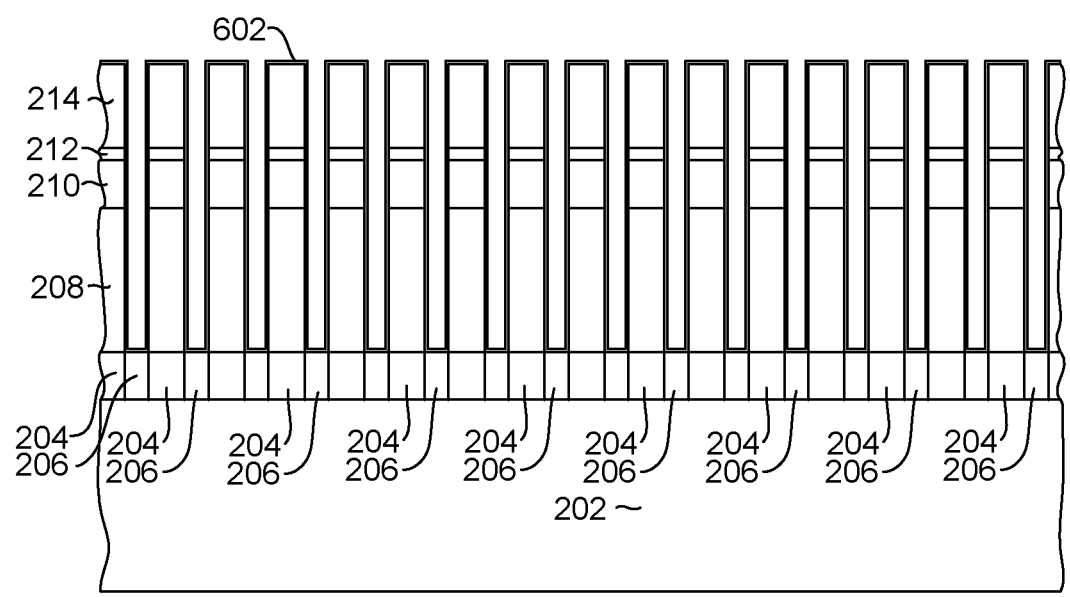

Then, with reference to FIG. 6, a thin passivation layer 602 is deposited by a conformal deposition method. The passivation layer 602 is a thin, non-magnetic, electrically insulating layer such as $SiO_2$ or $SiN_x$ that is deposited by a conformal deposition process such as atomic layer deposition (ALD) or chemical vapor deposition (CVD). The electrically insulating, passivating layer 602 can be deposited to a thickness of 1-10 nm, and is preferably performed in-situ, without breaking vacuum. That is to say, the deposition of the electrically insulating, passivating layer 602 is preferably deposited in the same chamber in which the previous ion milling operation described above with reference to FIG. 5 was performed, and without introducing any external atmosphere into the chamber.

Figure 7:
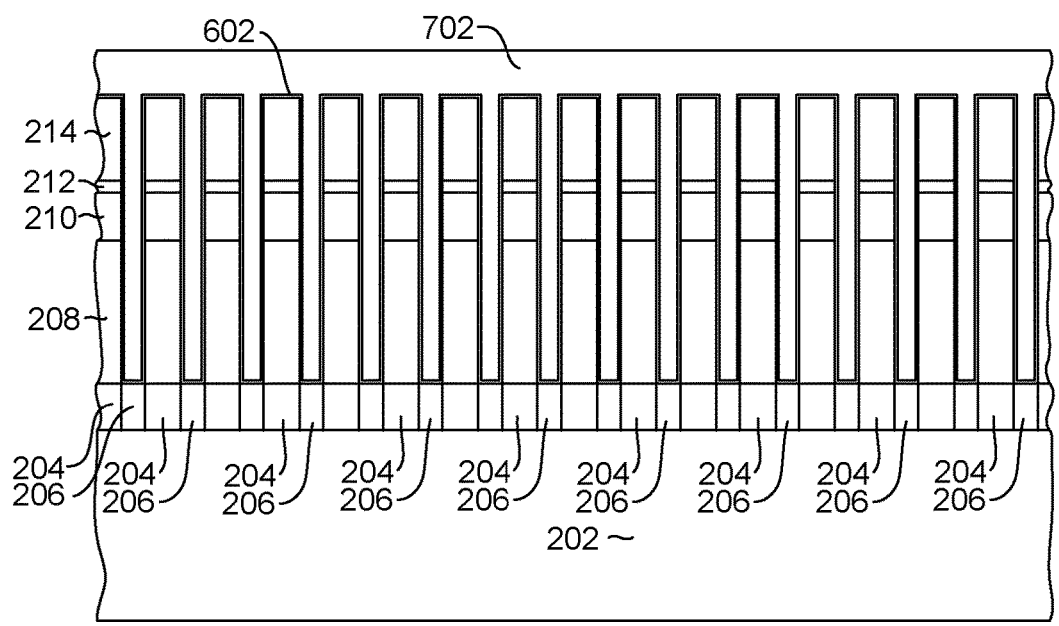

Then, with reference to FIG. 7, a thicker, non-magnetic, electrically insulating layer 702 is deposited to completely fill the spaces between the MTJ pillars 208, as well as between the cap/contact layers 210. This insulating layer 702 can be a material such as $SiO_2$ or $SiN_x$, which may be deposited by a conformal deposition process such as chemical vapor deposition (CVD) or atomic layer deposition (ALD). However, this deposition of layer 702 need not be performed in-situ, since the previously deposited thin insulation layer 602 protects the layer of the MTJ elements 210 during transfer to a different deposition chamber.

Figure 8:
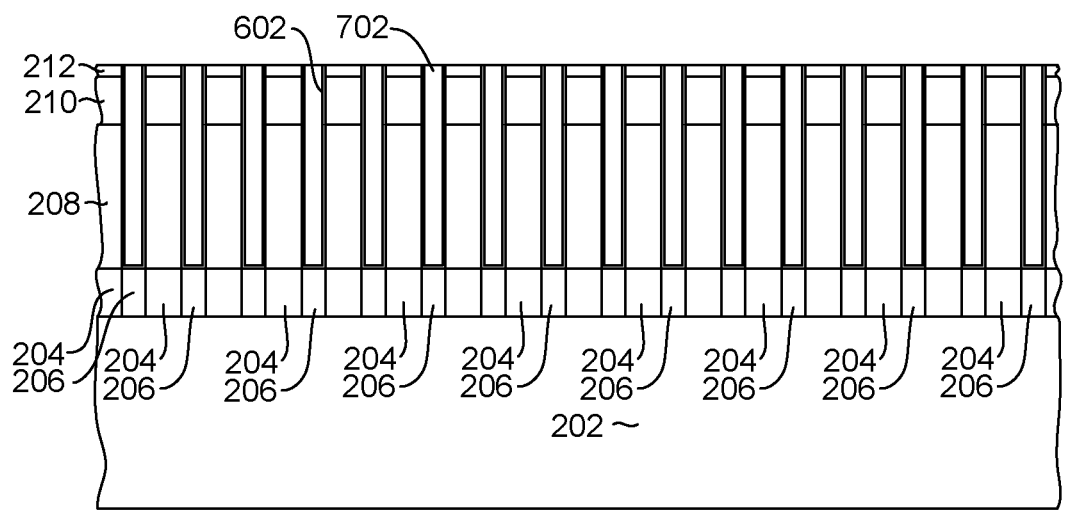
Figure 9:
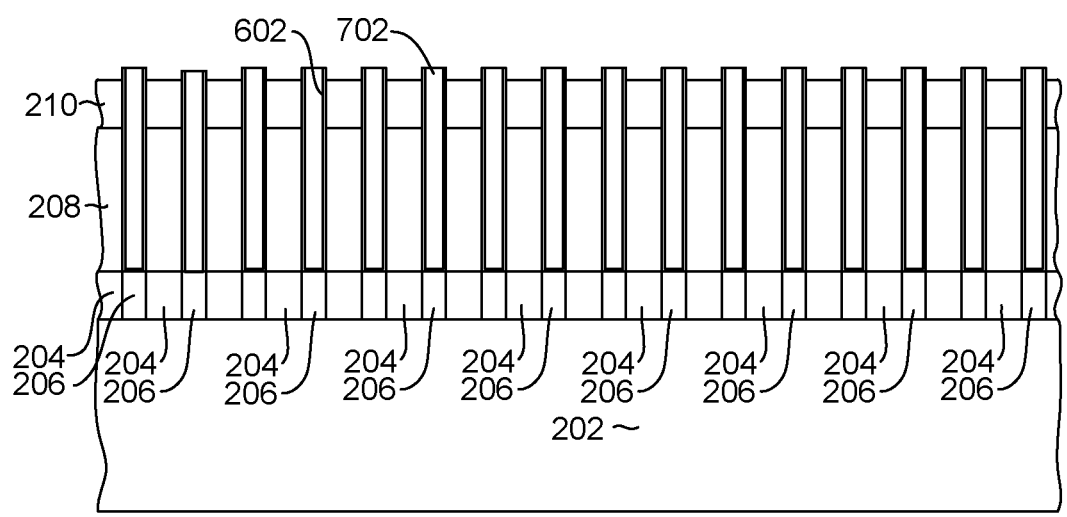

After the insulation layers 602, 702 have been deposited, a chemical mechanical polishing process (CMP) can be performed, leaving a structure such as shown in FIG. 8. The DLC layer 212 has a high resistance to CMP and, therefore, acts as an excellent CMP stop. Then, after the CMP process, the remaining DLC layer 212 can be removed. The remaining DLC layer can be removed by a reactive ion etching process performed in an oxygen containing atmosphere, such as $O_2$ or $CO_2$.

Figure 10:
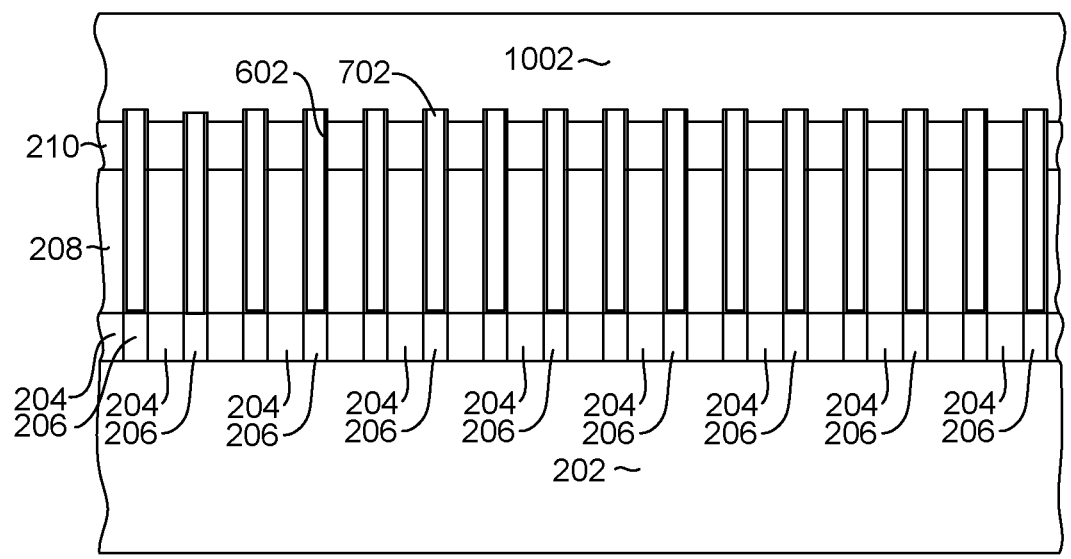
Figure 11:
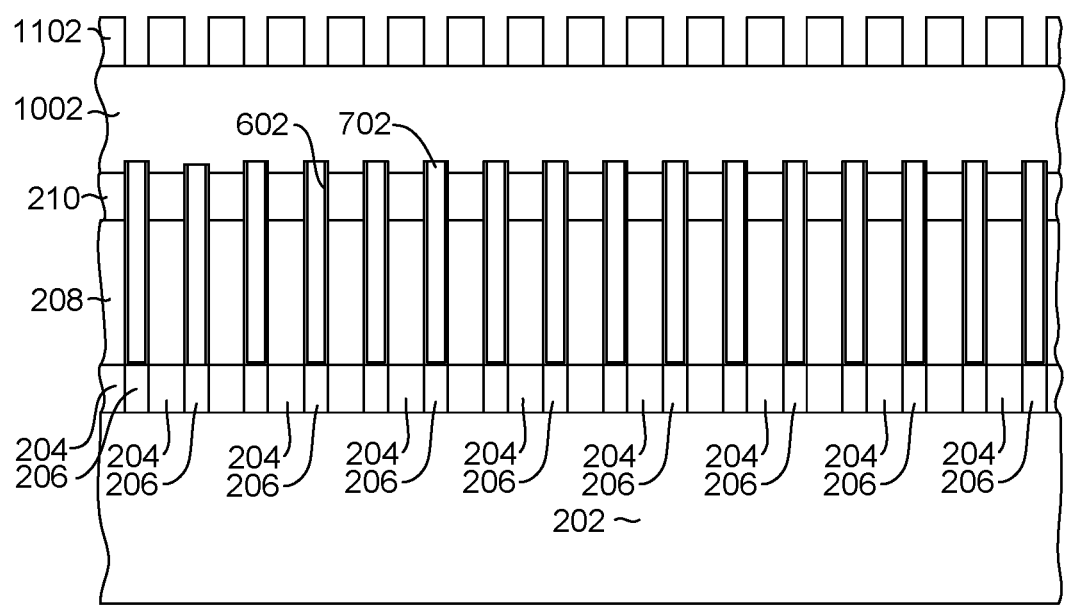

After the DLC layer 212 has been removed, a relatively thick layer of electrically conductive top electrode material 1002 can be deposited as shown in FIG. 10. The top electrode material 1002 can be a material such Au or Cu and can be deposited by sputter deposition or electroplating. Then, with reference to FIG. 11, an electrode defining mask 1102 can be formed over the top electrode material 1002. The electrode defining mask 1102 can be a photoresist layer that can be photolithographically patterned and developed to form a mask structure having mask material remaining where top electrodes are desired.

Figure 12:
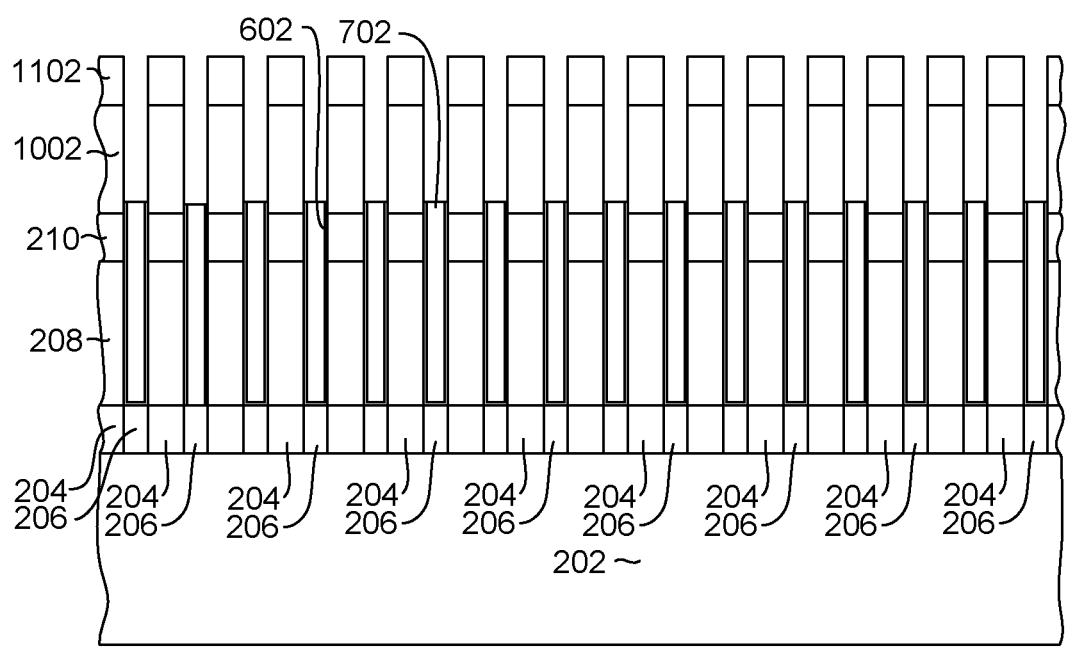
Figure 13:
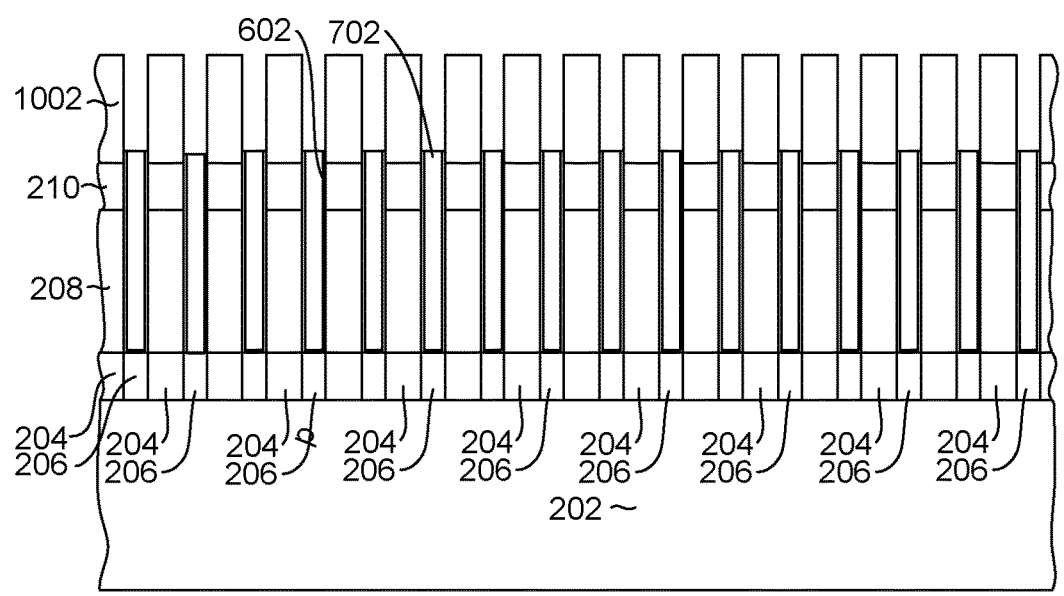
Figure 14:
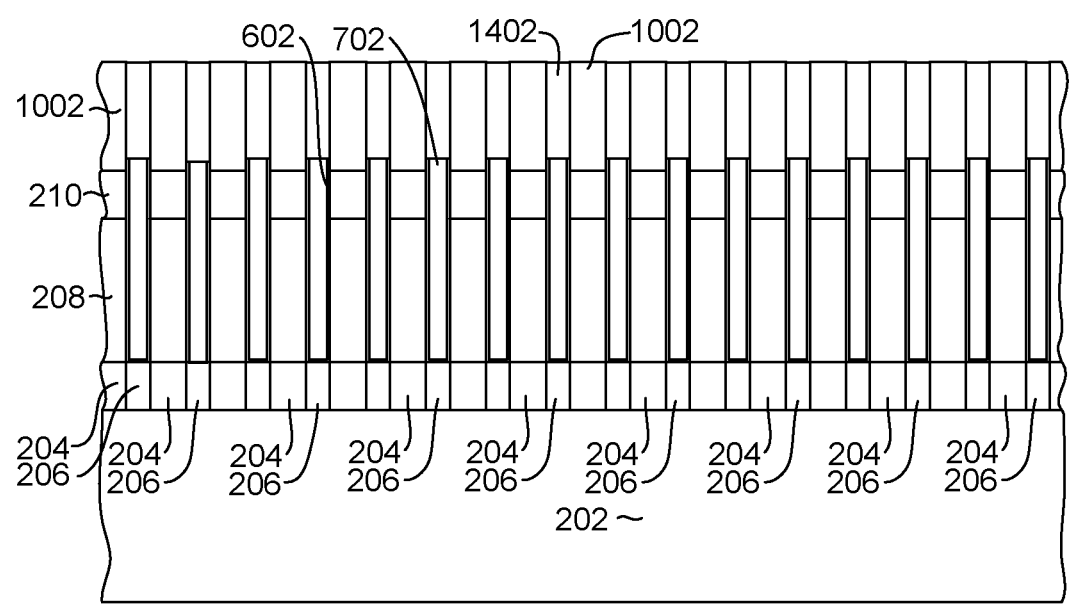

A reactive ion etching process can then be performed to remove portions of the electrode material 1002, leaving a structure as shown in FIG. 12 to define individual electrode structures 1002 formed over the pillars 208 and cap/contact layer 210. After the individual electrodes 1002 have been formed as shown in FIG. 12, a mask liftoff process can be performed to remove the mask 1102, leaving a structure as shown in FIG. 13. The mask liftoff can be, for example, a chemical liftoff process suitable for removing the photoresist material used to form the mask 1102. Alternatively, the electrode defining mask can be formed first and the electrode material can be deposited, such as by electroplating, into the openings in the mask.

After the mask 1102 has been removed, an insulating fill material such as $SiO_2$ or $SiN_x$ 1402 can be conformally deposited by a process such as atomic layer deposition (ALD) or chemical vapor deposition (CVD) to fill the spaces between the electrodes 1002. A chemical mechanical polishing process (CMP) can then be performed to planarize the structure and expose the tops of the electrodes, leaving a structure such as that shown in FIG. 14.

Figure 19:
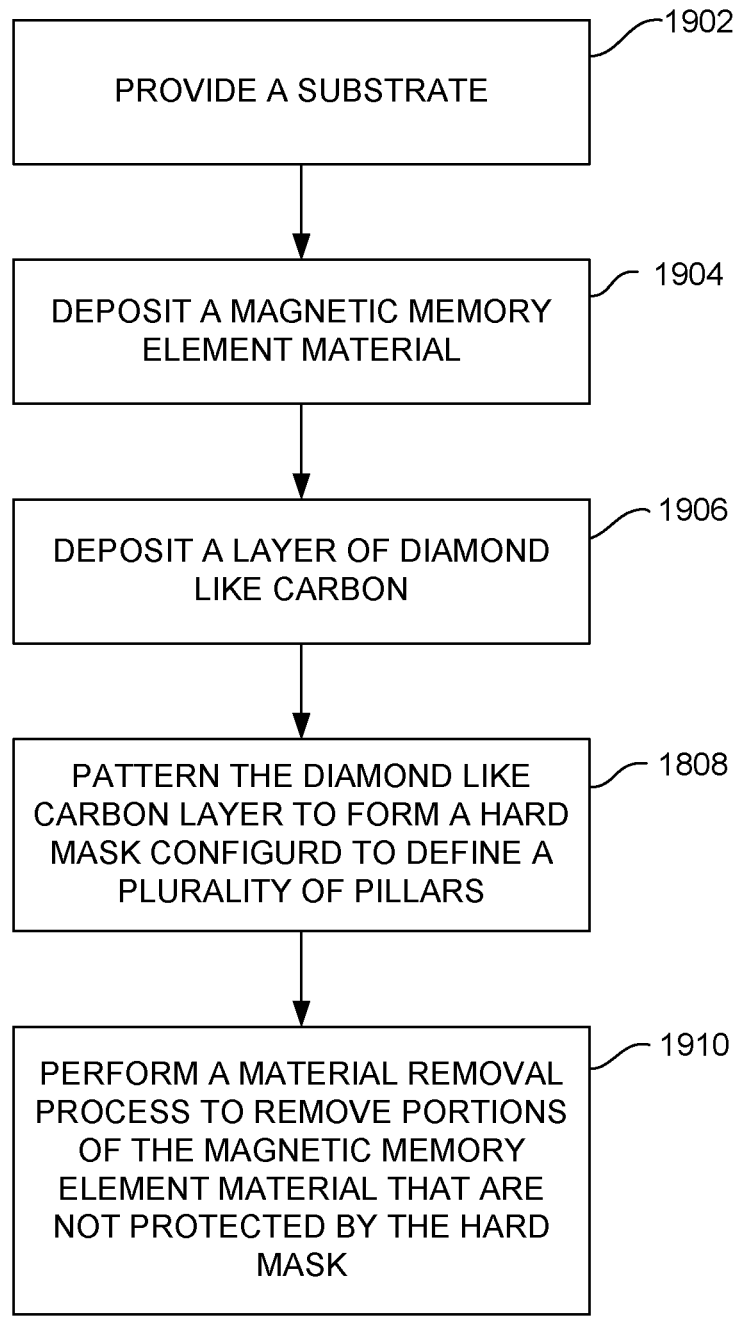
FIG. 19 is a flowchart summarizing a method for manufacturing high density magnetic random access memory.

The above described process for manufacturing magnetic random access memory can be summarized with reference FIG. 19. FIG. 19 shows a flowchart of a process that starts with a step 1902 of providing a substrate. The substrate can be a wafer on which circuitry such as CMOS circuitry can be incorporated and may have electrical contacts formed thereon for making electrical connection with the circuitry. The substrate can have a planar surface on which to deposit and process further material layers. Then, in a step 1904 a magnetic memory material is deposited over the substrate. As discussed above, the magnetic memory material can include various layers of material configured to form a magnetic random access memory element such as a magnetic tunnel junction (MTJ) element. For example, the magnetic memory material can include first and second magnetic layers that are separated from one another by a thin, non-magnetic, electrically insulating barrier layer.

Then, in a step 1906 a layer of diamond like carbon (DLC) is deposited over the magnetic memory material. Then, in a step 1908, the layer of diamond like carbon (DLC) is patterned to form a hard mask structure that is configured to define a plurality of magnetic memory element pillars. The patterning of the diamond like carbon layer can be performed by depositing a photoresist layer. A bottom anti-reflective coating (BARC) may be included beneath the photoresist layer. The photoresist layer can be patterned by photolithography or by focused ion beam exposure. The image of the patterned photoresist mask can be transferred onto the underlying diamond like carbon layer by a process such as reactive ion etching in an oxygen containing atmosphere such as $O_2$ or $CO_2$, which has a strong affinity for removing carbon. This removes portions of the diamond like carbon layer that are not protected by the patterned photoresist, leaving a desired patterned hard mask over the magnetic memory material. After transferring the image of the photoresist mask onto the underlying diamond like carbon layer, the photoresist and any underlying anti-reflective layer can be removed, such as by reactive ion etching.

Then, in a step 1810 a material removal process is performed to remove portions of the magnetic memory element material that are not protected by the diamond like carbon hard mask, thereby forming pillars of magnetic memory elements defined by the hard mask. The process used to remove the magnetic memory element material can be an ion or atom bombardment process such as ion milling. Because the diamond like carbon has a high resistance to removal by such processes, it can be formed as a very thin hard mask, having a thickness of only 10-20 nm. This, advantageously results in little shadowing effect during the ion milling process used to define the magnetic element memory pillars.

The use of Diamond Like Carbon (DLC) as a mask layer is also especially suitable in use with a partial mill process, wherein a first ion milling process is performed to remove memory element material only to the level of the non-magnetic barrier layer, and then the rest of the memory element material is removed in a subsequent ion milling process. Such a process can be useful for defining very tight pitch, high density magnetic recording structures, and is illustrated with reference to FIGS. 15-18.

Starting with a structure similar to that of FIG. 4, a mask structure that includes a diamond like carbon (DLC) hard mask 212 and photoresist mask structure 214 is formed over a magnetic tunnel junction layer 210 and cap/contact layer 212. Then, with reference to FIG. 15, an ion milling process is performed to remove a portion of the magnetic tunnel junction material 208. This first ion milling is performed just sufficiently to remove the magnetic free layer material 104, and just until the non-magnetic barrier layer 106 (described above with reference to FIG. 1) has been reached.

Figure 15:
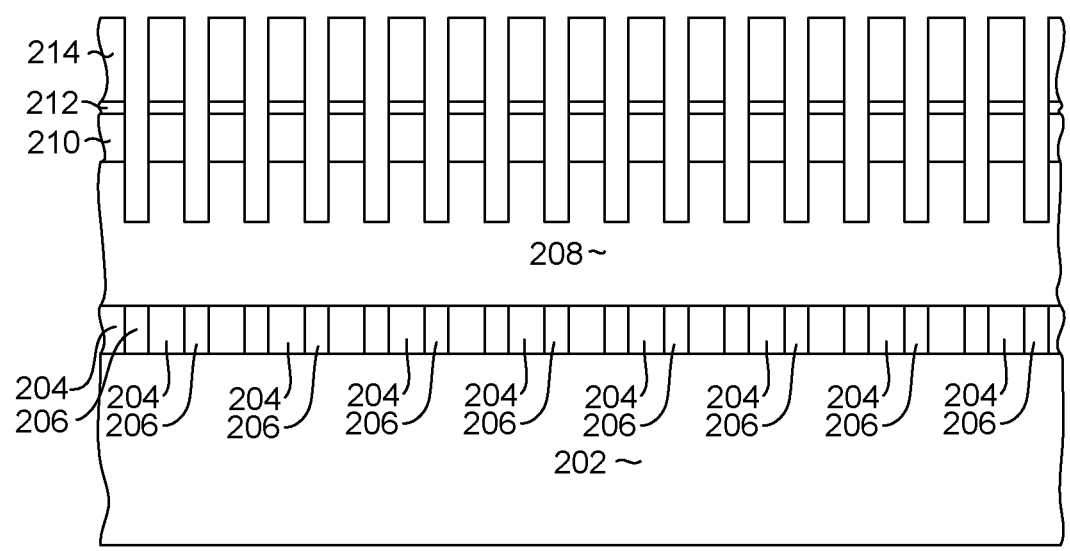
FIGS. 15-18 show a magnetic data device in various intermediate stages of manufacture, illustrating a method of manufacturing a magnetic data device according to an alternate embodiment.
Figure 16:
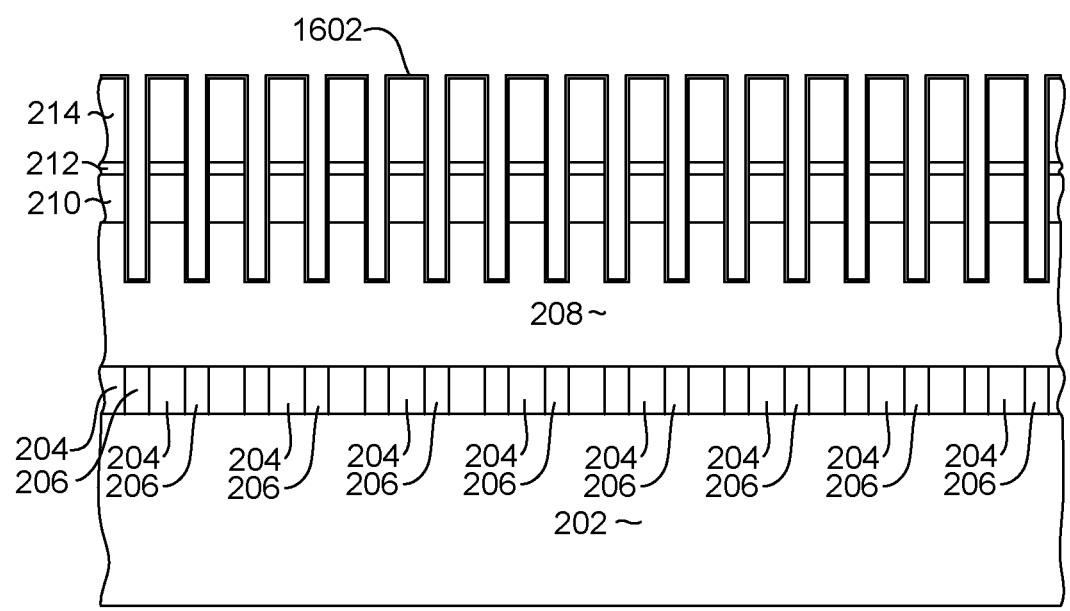

Then, with reference to FIG. 16, a thin insulating layer 1602 is deposited to protect the sides of the previously ion milled magnetic tunnel junction material 208. This thin insulation layer 1602 can be a material such as $SiO_2$ or $SiN_x$ and again is preferably deposited by a conformal deposition process such as atomic layer deposition (ALD) or chemical vapor deposition (CVD) so that it can effectively coat the vertical sides of the pillars formed up to this point, as shown in FIG. 15.

Figure 17:
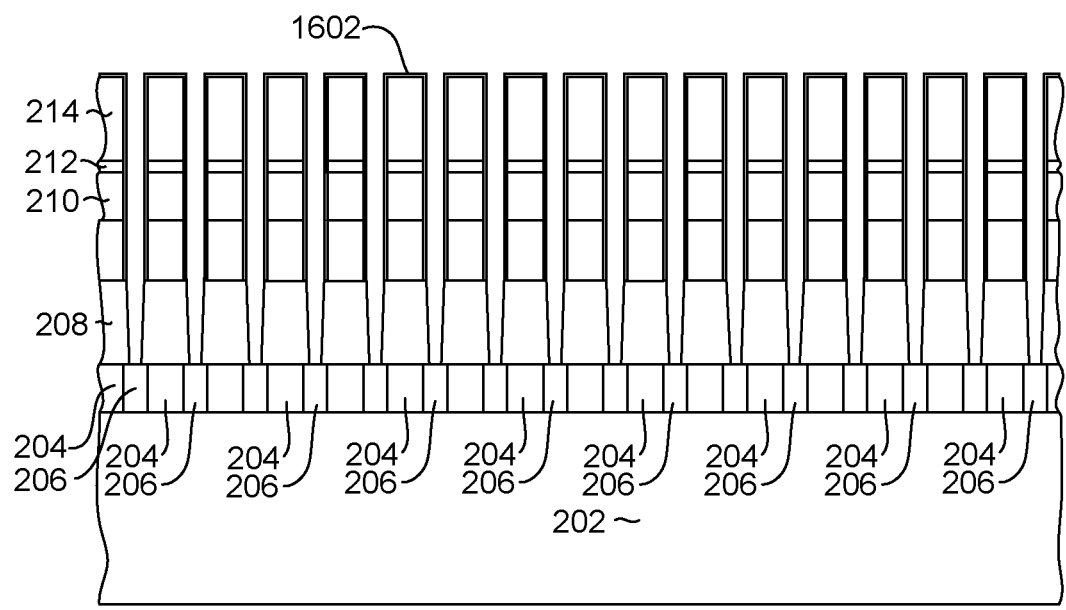
Figure 18:
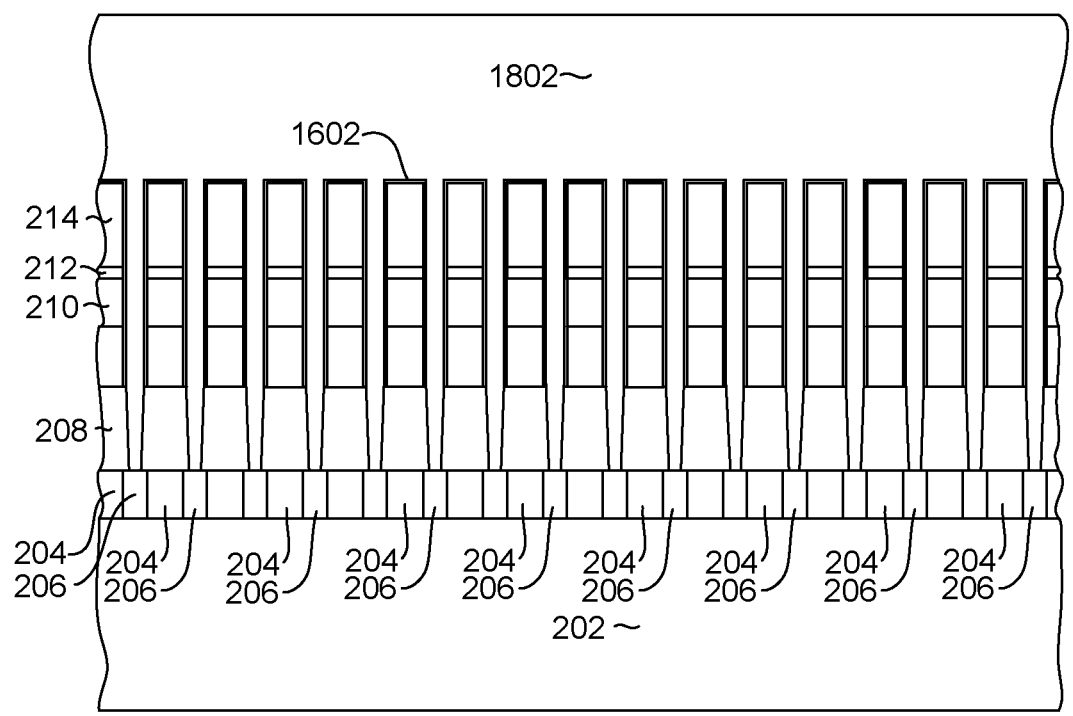

With reference now to FIG. 17, a second ion milling is performed. The second ion milling is performed to extend through the rest of the magnetic tunnel junction material 208 as shown in FIG. 17. Because the first ion milling was only performed to remove the free layer it can very accurately define the width and structure of the free layer, thereby accurately defining the functional width of the magnetic tunnel junction pillar. Then, during the second ion milling, the insulation layer 1602 protects the free layer so that the previously accurately defined width and sidewall structure remains intact during and after the second ion milling has been performed. As can be seen in FIG. 17, shadowing from the pillar and mask structures 208, 210, 212, 214 can cause some tapering of the bottom portion of the pillar 208. However, since the free layer width and sidewall structure has been accurately defined, the tapering of the sidewall of bottom portion of the magnetic tunnel junction pillar (which includes the reference layer 108 and underlying layers of FIG. 1) will not affect the performance of the magnetic tunnel junction element, so long as sufficient material has been removed to ensure electrical isolation of the magnetic tunnel junction pillars as is shown in FIG. 17.

After, the second ion milling has been performed to completely define the magnetic tunnel junction pillars, a non-magnetic, electrically insulating fill layer 1802 can be deposited to fill the space between the pillars 208, 210. Further processing can be performed, such as was previously described with reference to FIGS. 10-14.

Figure 20:
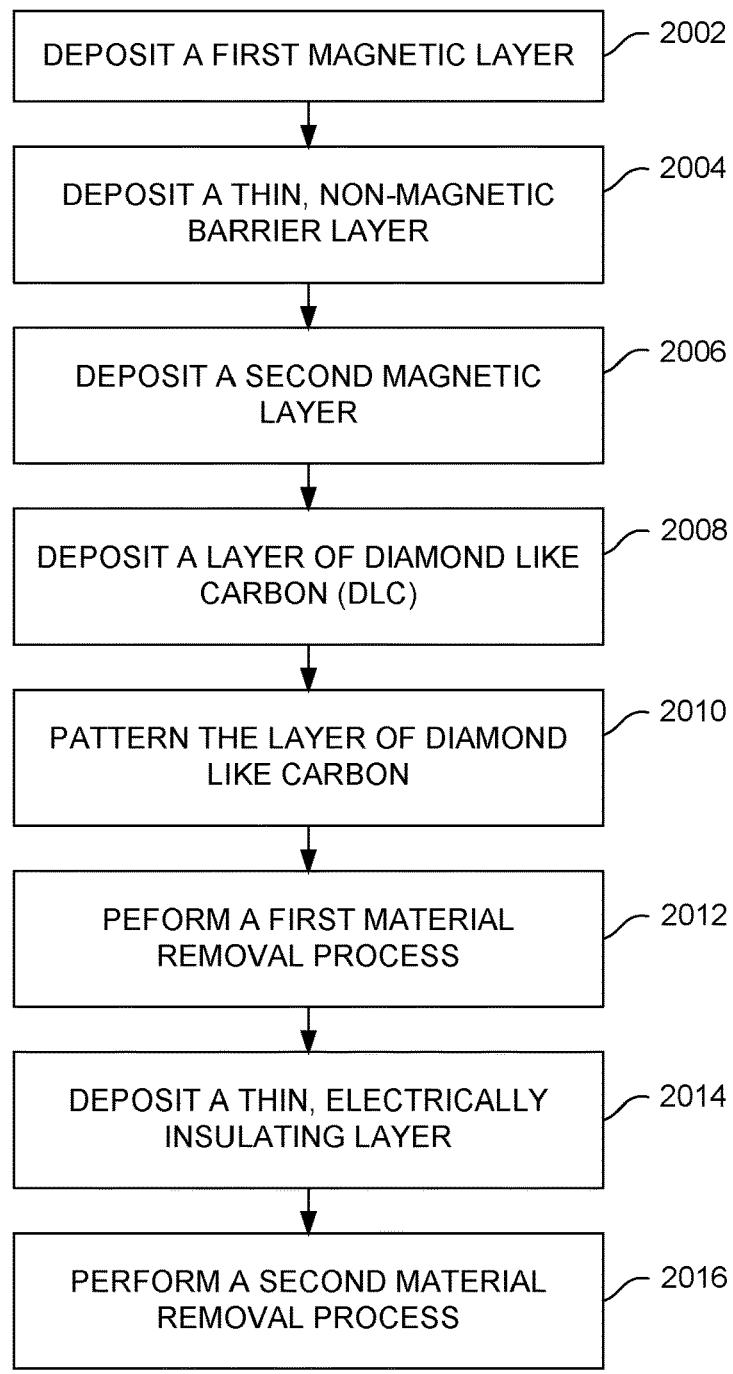
FIG. 20 is a flowchart summarizing another method for manufacturing high density magnetic random access memory.

The above described process can be summarized with reference to the flowchart shown in FIG. 20. In a step 2002, a first magnetic layer is deposited. This layer can be configured to be a reference layer of a magnetic tunnel junction element. Then, in a step 2004 a thin, non-magnetic, electrically insulating material is deposited over the first magnetic layer. This non-magnetic, electrically insulating layer can be a barrier layer of the magnetic tunnel junction element and can be for, example MgO. Then, in a step 2006, a second magnetic layer is deposited. The second magnetic layer can be the free magnetic layer of the magnetic tunnel junction element. In addition, other layers in addition to the first and second magnetic layers and the non-magnetic layer can also be deposited depending on design considerations.

Then, in a step 2008, a layer of diamond like carbon (DLC) is deposited. The DLC layer can be deposited by one or more of sputter deposition, plasma vapor deposition, or filtered cathodic arc deposition, and can be deposited to a thickness of 10-20 nm.

In a step 2010 the layer of diamond like carbon (DLC) is patterned to form a hard mask that is configured to define a plurality of magnetic memory pillars. The patterning of the DLC mask can be performed by coating the DLC layer with a layer of photoresist and then patterning the photoresist to define a phtoresist mask. The image of the photoresist mask can be transferred to the underlying DLC layer by performing a reactive ion etching in an oxygen containing atmosphere such as $O_2$ or $CO_2$.

Then, in a step 2012 a first material removal process is performed. The first material removal process can be an atom or ion bombardment process such as ion milling. The first material removal process is performed to extend only through the second magnetic layer, stopping at the non-magnetic layer, leaving the first magnetic layer substantially intact.

Then, in a step 2014, a thin layer of electrically insulating material is deposited. This thin layer of electrically insulating material can be, for example, $SiO_2$ or $SiN_x$ and is preferably deposited by a conformal deposition method such as atomic layer deposition (ALD) or chemical vapor deposition (CVD). Then, in a step 2016 a second material removal process is performed. Like the first material removal process, the second material removal process can be an atom or ion bombardment process, such as ion milling. The second ion milling process is performed to extend through the first magnetic layer and through any other magnetic memory element material, removing portions of the first magnetic layer that are not protected by the second magnetic layer.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments, but should be defined only in accordance with the following claims and their equivalents.

What is claimed is:
1. A method for manufacturing magnetic random access memory, the method comprising:
providing a substrate;
depositing a magnetic memory element material over the substrate;

depositing a layer of diamond like carbon over the magnetic memory element material;

patterning the diamond like carbon to form a diamond like carbon hard mask that is configured to define a plurality of pillars; and performing a material removal process to remove portions of the magnetic memory element material that are not protected by the diamond like carbon hard mask to form pillars of magnetic memory element material, wherein the material removal process is an ion or atom bombardment process.

2. The method as in claim 1, wherein the material removal process comprises ion milling.

3. The method as in claim 1, wherein the magnetic memory element material includes a plurality of material layers configured to form a magnetic tunnel junction element.

4. The method as in claim 1, wherein the magnetic memory element material includes first and second magnetic layers and a thin layer of non-magnetic, electrically insulating material located between the first and second magnetic layers.

5. The method as in claim 1, wherein the patterning of the diamond like carbon layer further comprises:
depositing a layer of photoresist;
patterning the layer of photoresist; and
performing a reactive ion etching to remove portions of the diamond like carbon layer that are not protected by the patterned layer of photoresist.

6. The method as in claim 5, wherein the patterning of the photoresist layer further comprises photolithographically patterning the layer of photoresist.

7. The method as in claim 5, wherein the patterning of the photoresist layer further comprises electron beam exposure.

8. The method as in claim 1, wherein the layer of diamond like carbon has a thickness of 10-20 nm.

9. The method as in claim 1, wherein the layer of diamond like carbon is deposited by sputter deposition.

10. The method as in claim 1, wherein the layer of diamond like carbon is deposited by plasma vapor deposition.

11. The method as in claim 1, wherein the layer of diamond like carbon is deposited by filtered cathodic arc deposition.

12. The method as in claim 1, further comprising, after performing the material removal process, depositing a thin, electrically insulating layer, the thin, electrically insulating layer being deposited in-situ.

13. The method as in claim 12, further comprising, after depositing the thin layer of electrically insulating material, depositing an insulating fill layer, performing a chemical mechanical polishing process and removing the remaining diamond like carbon hard mask by reactive ion etching in an atmosphere that contains one or more of $CO_2$ and $O_2$.

14. The method as in claim 1, wherein the material removal process is performed in a chamber under a vacuum, and further comprising after performing the material removal process, depositing a thin, electrically insulating layer by a conformal deposition process in the chamber without breaking the vacuum.

15. A method for manufacturing magnetic random access data memory, the method comprising:
depositing a first magnetic layer;
depositing a thin, non-magnetic, electrically insulating barrier layer over the first magnetic layer;
depositing a second magnetic layer over the thin, non-magnetic, electrically insulating layer;
depositing a layer of diamond like carbon;
patterning the layer of diamond like carbon to form a hard mask;
performing a first material removal process to remove portions of the second magnetic layer that are not protected by the hard mask, the first material removal process being terminated before all of the first magnetic layer;
after performing the first material removal process, depositing a thin electrically insulating layer by a conformal deposition process; and
after depositing the thin electrically insulating layer, performing a second material removal process to remove portions of the first magnetic layer that are not protected by the second magnetic layer;
wherein the first and second material removal processes comprise an ion or atom bombardment process.

16. The method as in claim 15, further comprising, after performing the second material removal process, depositing a non-magnetic, electrically insulating fill material.

17. The method as in claim 15, wherein the first and second material removal processes comprise ion milling.

18. The method as in claim 15, wherein the layer of diamond like carbon is deposited to a thickness of 10-20 nm.

* * * * *